(12) United States Patent
Baker et al.

(10) Patent No.: US 7,416,481 B2
(45) Date of Patent: Aug. 26, 2008

(54) BLOWER EXHAUST BACKFLOW DAMPER

(75) Inventors: Bruce E. Baker, Round Rock, TX (US); Matthew S. Henry, Raleigh, NC (US); David J. Jensen, Raleigh, NC (US); Seth D. Lewis, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 417 days.

(21) Appl. No.: 11/368,778

(22) Filed: Mar. 6, 2006

(65) Prior Publication Data

US 2007/0207723 A1 Sep. 6, 2007

(51) Int. Cl.
*H05K 7/20* (2006.01)
*F24F 13/08* (2006.01)
*F24F 7/00* (2006.01)

(52) U.S. Cl. ............... 454/184; 454/259; 454/353; 361/687; 361/695

(58) Field of Classification Search ............ 454/184, 454/227, 229, 259, 353, 359; 361/687, 695
See application file for complete search history.

(56) References Cited

U.S. PATENT DOCUMENTS

| | | | |
|---|---|---|---|
| 4,445,426 A * | 5/1984 | Bohanon, Sr. ............ 454/351 |
| 5,733,189 A * | 3/1998 | Eastwood ............... 454/155 |
| 6,011,689 A * | 1/2000 | Wrycraft ............... 361/695 |
| 6,042,348 A * | 3/2000 | Aakalu et al. ........... 417/423.5 |
| 6,111,748 A * | 8/2000 | Bhatia ................. 361/695 |
| 6,229,701 B1 * | 5/2001 | Kung et al. ............ 361/688 |
| 6,688,965 B1 * | 2/2004 | Crippen et al. .......... 454/184 |
| 6,705,833 B2 * | 3/2004 | Tam et al. ............. 415/146 |
| 6,837,785 B2 * | 1/2005 | Soderlund ............. 454/184 |

FOREIGN PATENT DOCUMENTS

JP            58150734 A  *  9/1983

* cited by examiner

*Primary Examiner*—Steven B. McAllister
*Assistant Examiner*—Patrick F O'Reilly, III
(74) *Attorney, Agent, or Firm*—Cynthia S. Byrd; Schubert Osterrieder & Nickelson PLLC

(57) ABSTRACT

A system, method, and apparatus for preventing exhaust backflow into a blower are disclosed. Embodiments may include a blower system with an invertible blower chassis having a blower exhaust to direct airflow from the blower chassis at an airflow angle. The system may also include a backflow damper frame attached to the blower chassis and positioned to receive airflow from the blower chassis and one or more vertical damper vanes rotatably attached to the backflow damper frame. Each damper vane may freely rotate between a first, closed position and a second, open position. The damper vanes may block airflow into the blower exhaust when in the closed position and may freely rotate to a position where the damper vanes are substantially parallel to the airflow from the blower exhaust. The damper vanes may each include a vane pin to rotatably attach to frame holes of the backflow damper frame.

15 Claims, 9 Drawing Sheets

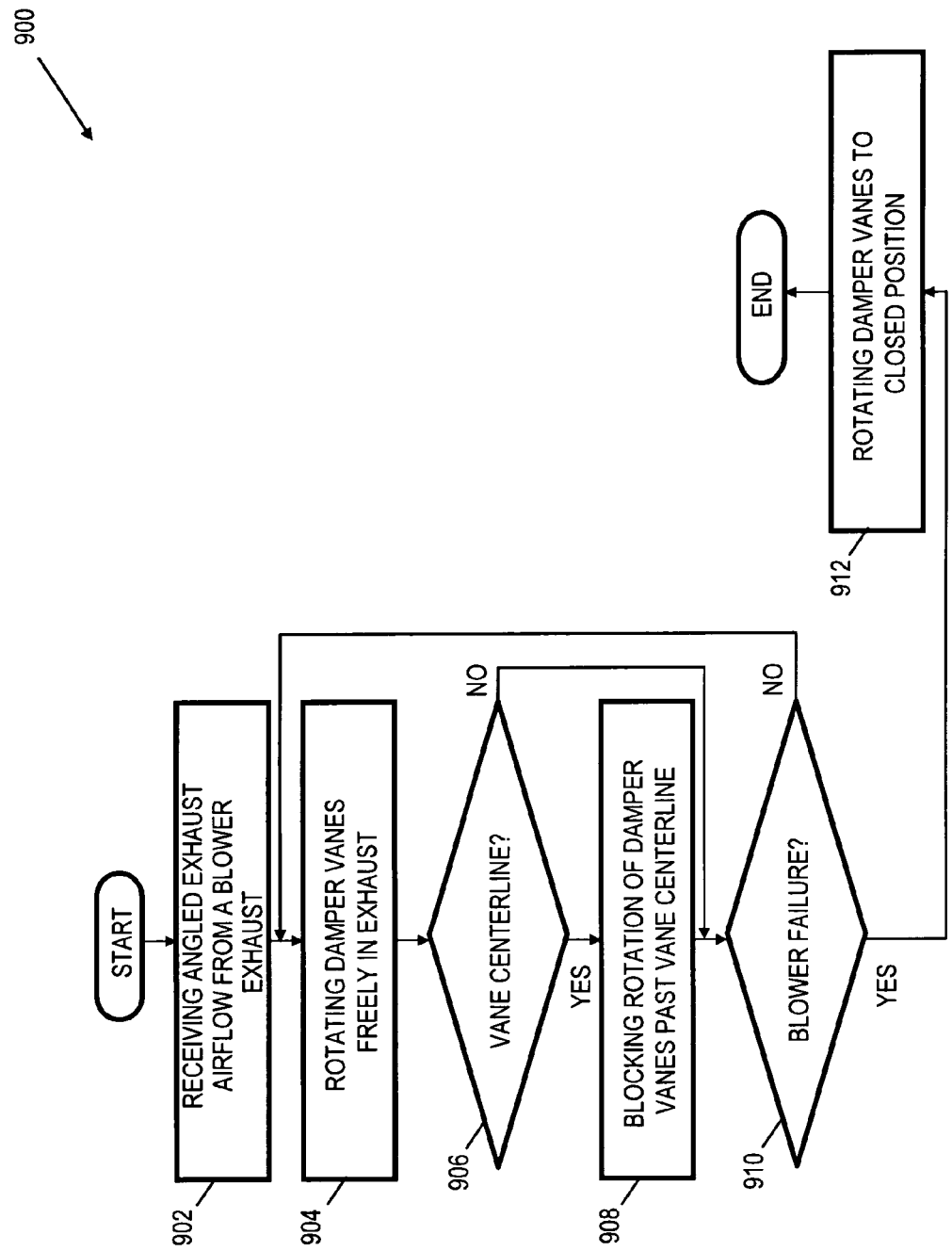

BLOWER EXHAUST BACKFLOW DAMPER

FIELD OF INVENTION

The present invention generally relates to the field of blowers for cooling of computer servers, computer systems, or other systems. More particularly, the present invention relates to a system, method, and apparatus to prevent blower exhaust backflow, particularly for blowers used for cooling of blade servers.

BACKGROUND

In today's environment, a server computer system often includes several components, such as the server itself, hard drives, or other peripheral devices. These components are generally stored in racks. For a large organization, the storage racks can number in the hundreds and occupy huge amounts of expensive floor space. Also, because the components are generally free standing components (i.e., they are not integrated), resources such as disk drives, keyboards, and monitors cannot easily be shared. Blade servers have been developed to bundle the server computer system described above into a compact operating unit. A blade server may be a high-density, rack-mounted packaging architecture for servers that provides input/output (I/O), systems management, and power to individual blades. Blades may include servers, processor nodes, storage nodes, or other components and may each plug into and operationally connect to the blade server to share in resources such as power, cooling, network connectivity, management functions, and access to other shared resources (such as a front-panel or CD-ROM drive). One feature of blade servers is that individual blades may be 'hot swapped' without affecting the operation of other blades in the system. An administrator or other user may simply remove one blade (such as one that is inoperable or that will be replaced) and place another in its place. An example blade server is International Business Machines (IBM®) Corporation's IBM eServer™ BladeCenter® system, a high-density, rack-mounted packaging architecture for servers that provides I/O, systems management, and power to inserted blades.

In server design, as in the design of many other types of computer systems, there is a trend towards higher densities of components. For example, it is often desirable to put a greater number of server blades into a package of given size. Additionally, server designers (similarly to designers of other computer systems) continue to increase performance of server components in order to meet customer needs. In combination, the higher component densities and increased performance of components result in an increased need for cooling of the servers and their components. Such increased cooling needs are likely to continue to rise as component densities and performance both increase. Accordingly, blade servers typically cool their component blades by drawing air through the chassis of the blade server and thus through each blade (or fillers) via the use of blowers in a front-to-back blade cooling pattern. For many blade server designs, the blowers are required to be invertible so that the blower functions properly in both the standard and inverted positions.

One problem with blowers is that, in the event of failure of the blower fan, air may recirculate back into a blower through its exhaust. While this problem can occur with blowers in any system, this problem is exacerbated for blade server blowers because blower air inlets typically face each other and hot exhaust air recirculating through a failed blower will negatively impact the performance of the other blower. In this situation, the remaining functional blower draws air from the back of the system through the failed blower and exhausts it out the back again, severely reducing the flow of cooling air through the blade system as a whole. Designers have provided one solution to this problem by providing a backflow damper with a frame and several pivoting vanes that are installed horizontally. In the event of blower failure, these pivoting vanes utilize gravity to close when blower air no longer keeps them open (i.e., after blower failure) and thus prevent recirculation of air back into the blower. This solution, however, greatly increases the impedance of the air exiting the blower as the air exiting, the blower must overcome the gravitational forces on the vanes. Moreover, an extra vane must be added to the last position to satisfy the inversion requirement, increasing the cross-sectional 'blockage' of the blower exhaust and thus increasing the impedance.

Another solution to the problem of blower exhaust backflow is to use a single large vane installed vertically on either side of the frame that is spring-loaded to close when the blower fails. This solution satisfies the inversion requirement but also greatly increases the impedance of the backflow damper as the air exiting the blower must overcome the spring force, which must be relatively large to close the vane during failure and during shipping. There is, therefore, a need for an effective and efficient system to preventing exhaust backflow from a blower.

SUMMARY OF THE INVENTION

The problems identified above are in large part addressed by a system, method, and apparatus for preventing exhaust backflow into a blower. Embodiments may include a blower system that includes an invertible blower chassis having a blower exhaust to direct an airflow from the blower chassis at an airflow angle from an axis perpendicular to the chassis, where the blower chassis may also be used with a first side and a second, opposite side being substantially perpendicular to a vertical axis aligned with a gravitational force. The system may also include a backflow damper frame attached to the blower chassis and positioned to receive airflow from the blower chassis and one or more vertical damper vanes rotatably attached to the backflow damper frame. Each damper vane may have a vane body and the damper vanes may freely rotate between a first, closed position and a second, open position. The damper vanes may block airflow into the blower exhaust when the damper vanes are in the closed position and may freely rotate to a position where the vane bodies are substantially parallel to the airflow from the blower exhaust. In a further embodiment, the damper vanes may each include a vane pin to rotatably attach to frame holes of the backflow damper frame. In a further embodiment, the damper vanes may be constrained to rotate within approximately ninety (90) degrees or less from the closed position.

Another embodiment provides a backflow damper apparatus for a blower having a backflow damper frame having a perimeter defining an airflow area and one or more damper vanes rotatably attached to the perimeter of the backflow damper frame. The backflow damper frame may receive and pass airflow from a blower exhaust through the airflow area where the airflow exhaust flows substantially at an airflow angle from an axis perpendicular to the airflow area. The one or more damper vanes may each have a vane body with a long axis where the long axes of the vane bodies are adapted to be vertically oriented when the backflow damper is attached to the blower. The damper vanes may freely rotate between a first, closed position and a second, open position, where the damper vanes block airflow into the blower exhaust when the damper vanes are in the closed position and where the damper vanes rotate to a position where the vane bodies are substantially parallel to the airflow from the blower exhaust during blower operation. In a further embodiment, the damper vanes may be constrained to rotate within approximately ninety (90) degrees or less from the closed position.

Another embodiment provides a method for preventing exhaust backflow from a blower. Embodiments of the method may include receiving angled exhaust from a blower exhaust, where the blower exhaust airflow is angled less than ninety (90) degrees from perpendicular to the blower. The method may also include rotating one or more damper vanes freely in the blower exhaust during operation of the blower and, in the event of failure of the blower, rotating the damper vanes to a closed position via a pressure force applied to the damper vanes resulting from a lower pressure inside the blower than the ambient pressure outside the blower.

BRIEF DESCRIPTION OF THE DRAWINGS

Advantages of the invention will become apparent upon reading the following detailed description and upon reference to the accompanying drawings in which, like references may indicate similar elements:

FIG. 9 depicts an example of a flow chart depicting closing a backflow damper upon failure of a blower according to one embodiment.

DETAILED DESCRIPTION OF EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments; but, on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

A system, method, and apparatus for preventing exhaust backflow from a blower are disclosed. Embodiments may include a blower system that includes an invertible blower chassis having a blower exhaust to direct an airflow from the blower chassis at an airflow angle from an axis perpendicular to the chassis, where the blower chassis may also be used with a first side and a second, opposite side being substantially perpendicular to a vertical axis aligned with a gravitational force. The system may also include a backflow damper frame attached to the blower chassis and positioned to receive airflow from the blower chassis and one or more vertical damper vanes rotatably attached to the backflow damper frame. Each damper vane may have a vane body and the damper vanes may freely rotate between a first, closed position and a second, open position. The damper vanes may block airflow into the blower exhaust when the damper vanes are in the closed position and may freely rotate to a position where the vane bodies are substantially parallel to the airflow from the blower exhaust. In a further embodiment, the damper vanes may each include a vane pin to rotatably attach to frame holes of the backflow damper frame.

As will be discussed in more detail subsequently, the disclosed apparatus and system may provide for an efficient and effective mechanism for preventing exhaust backflow upon failure of a blower. The chassis architecture of the blower may provide an angled exhaust flow that, when combined with the disclosed vanes, provides for a lower impedance solution that may be particularly useful for invertible blowers. When a blower failure occurs, the configuration of the remaining air devices in the chassis may create a sufficiently low pressure relative to ambient air to force the damper vanes closed and prevent substantial exhaust backflow. The disclosed vertical vanes may provide less impedance than the previous horizontal vane design as gravitational forces need not be overcome and cross-sectional impedance is reduced due to not needing a vane in the last position. The disclosed vertical, freely rotating vanes may also provide less impedance than previous spring-loaded designs as the torsion springs need no longer be overcome.

Figure 1:
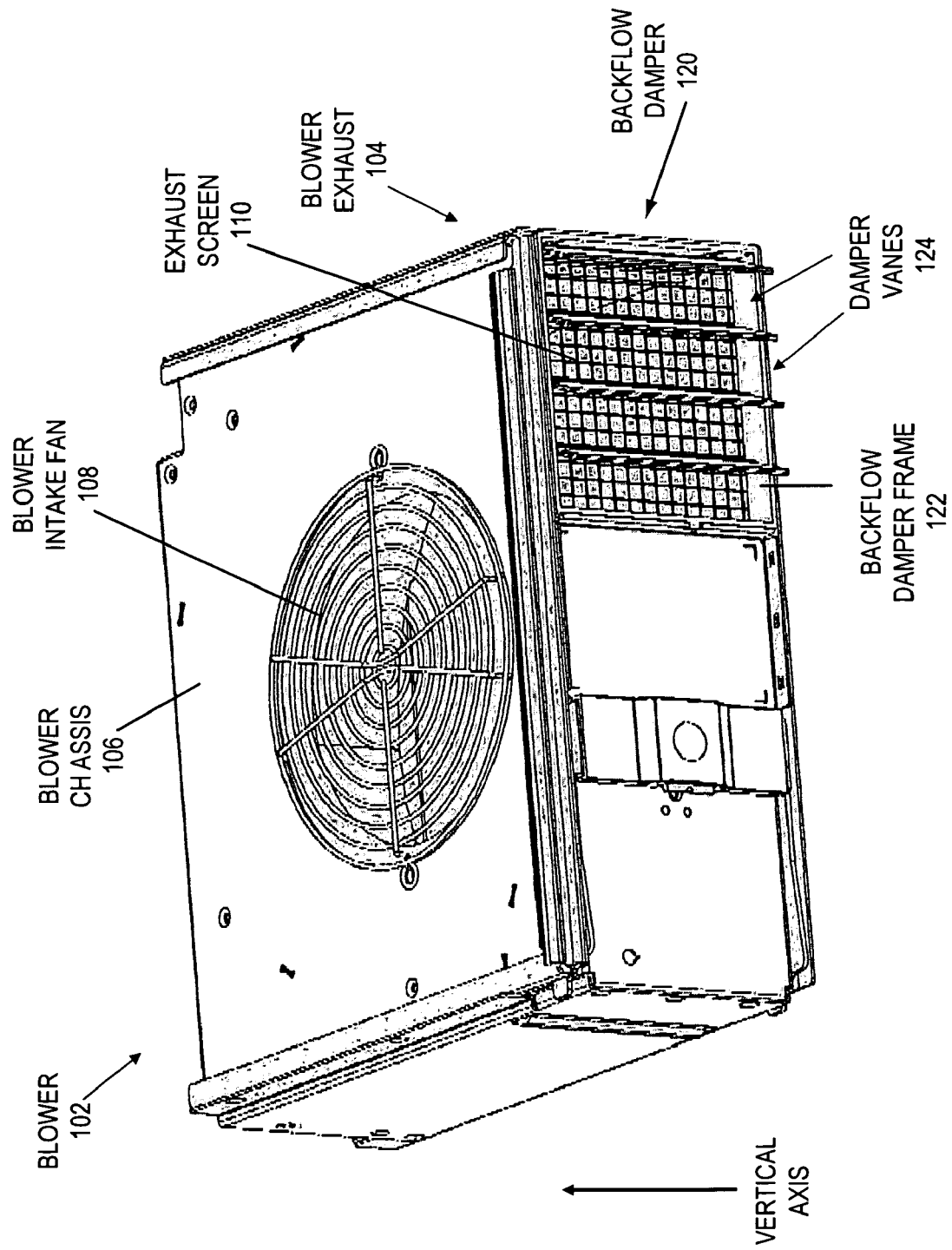
FIG. 1 depicts a front, top, and left side perspective view of an invertible blower with a backflow damper with damper vanes according to one embodiment.

Turning now to the drawings, FIG. 1 depicts a front, top, and left side perspective view of an invertible blower with a backflow damper with damper vanes according to one embodiment. The blower 102 may be invertible and able to operate in the depicted orientation as well as an inverted orientation (flipped over with respect to the vertical axis). The blower 102 may include a blower chassis 106 and a blower intake fan 108. The blower intake fan 108 may draw air into the blower 102 and the internal architecture of the blower 102 may direct air to the blower exhaust 104 for ejection from the blower 102 into an ambient environment. The internal chassis 106 design may provide for an angled exhaust airflow that is at an acute angle from a perpendicular angle from the front side of the blower 102. In the depicted embodiment of FIG. 1, the exhaust airflow is directed outward and to the left towards the side of the chassis 106 without the blower exhaust 104. The blower exhaust 104 may also have an optional exhaust screen 110 to prevent foreign objects (e.g., debris, fingers) from entering the blower chassis 106.

A backflow damper 120 may be installed at the blower exhaust 104 to assist in preventing substantial exhaust backflow in the event of blower 102 failure. The backflow damper 120 may either be integrated into the blower chassis 106 or attached to the blower chassis 106 and may be positioned to receive and pass air from the blower exhaust 104. The backflow damper 120 may include a backflow damper frame 122 having a perimeter that substantially surrounds the blower exhaust 104 exit to form an airflow area. One or more damper vanes 124 may be installed or positioned within the backflow damper frame 122 such that they are rotatably attached to the backflow damper frame 122 and may rotate, or pivot, freely in the airflow during blower 102 operation (with possible restrictions described subsequently). The damper vanes 124 may be advantageously aligned with the vertical axis so that they may rotate independent of the gravitational force when the blower 102 is in its normal or inverted positions, reducing the impedance of the backflow damper 120 when compared to horizontal vanes subject to gravitational losses.

During normal operation of the blower 102 (and as will be described in more detail in relation to FIG. 2), the airflow exiting the blower exhaust 104 is at an angle from the perpendicular and the damper vanes 124 may rotate so that they become substantially parallel with the airflow. The damper vanes 124 may naturally rotate within the airflow to their lowest impedance position by, in some embodiments, presenting their thinnest edge to the airflow. In some embodiments, the airflow is always at an acute angle and the damper vanes 124 accordingly rotate within a ninety (90) degree maximum range. The damper vanes 124 of the disclosed system are not spring-loaded and thus the spring force need not be overcome, reducing the impedance of the damper vanes 124 when compared to spring-loaded vanes. While the damper vanes 124 are described herein as freely rotating, they may still be subject to nominal forces such as frictional forces from their attachment to the backflow damper frame 122 and free rotation shall refer to rotation absent from relatively large forces such as spring forces or gravitational forces that impact rotation.

When the blower 102 fails (and as described in more detail in relation to FIG. 3), the exhaust airflow stops and a lower than ambient pressure may be created inside the blower chassis 106. The pressure differential may rotate the damper vanes 124 shut to prevent any substantial backflow into the blower exhaust 104 (a nominal amount may enter during the rotation of the damper vanes 124), which may improve performance of other blowers 102 in a system or prevent reduced cooling or other detrimental effects. As will be described in more detail subsequently, the disclosed system may accordingly provide a backflow damper system with reduced impedance when compared to previous designs while still providing the ability to be inverted and to substantially prevent exhaust backflow.

One or more damper vanes 124 may be utilized in the backflow damper 120. In one embodiment, a single damper vane 124 mounted at one side and of sufficient size to cover the airflow area of the backflow damper frame 122 may be utilized. In other embodiments, a plurality of damper vanes 124 may be used. The depicted backflow damper 120 includes four damper vanes 124 of substantially equal size with the first damper vane 124 being attached at the outermost edge of the blower 120. Cross-sectional impedance caused by the damper vanes 124 may be minimized by using as few damper vanes 124 as possible and allowing them to self-orient with the exhaust flow. Smaller damper vanes 124, however, may be more suitable for transport. The optimal number of damper vanes 124 and their relative sizes will depend on the damper vane 124 design, blower 102 design, and operational requirements.

Figure 2:
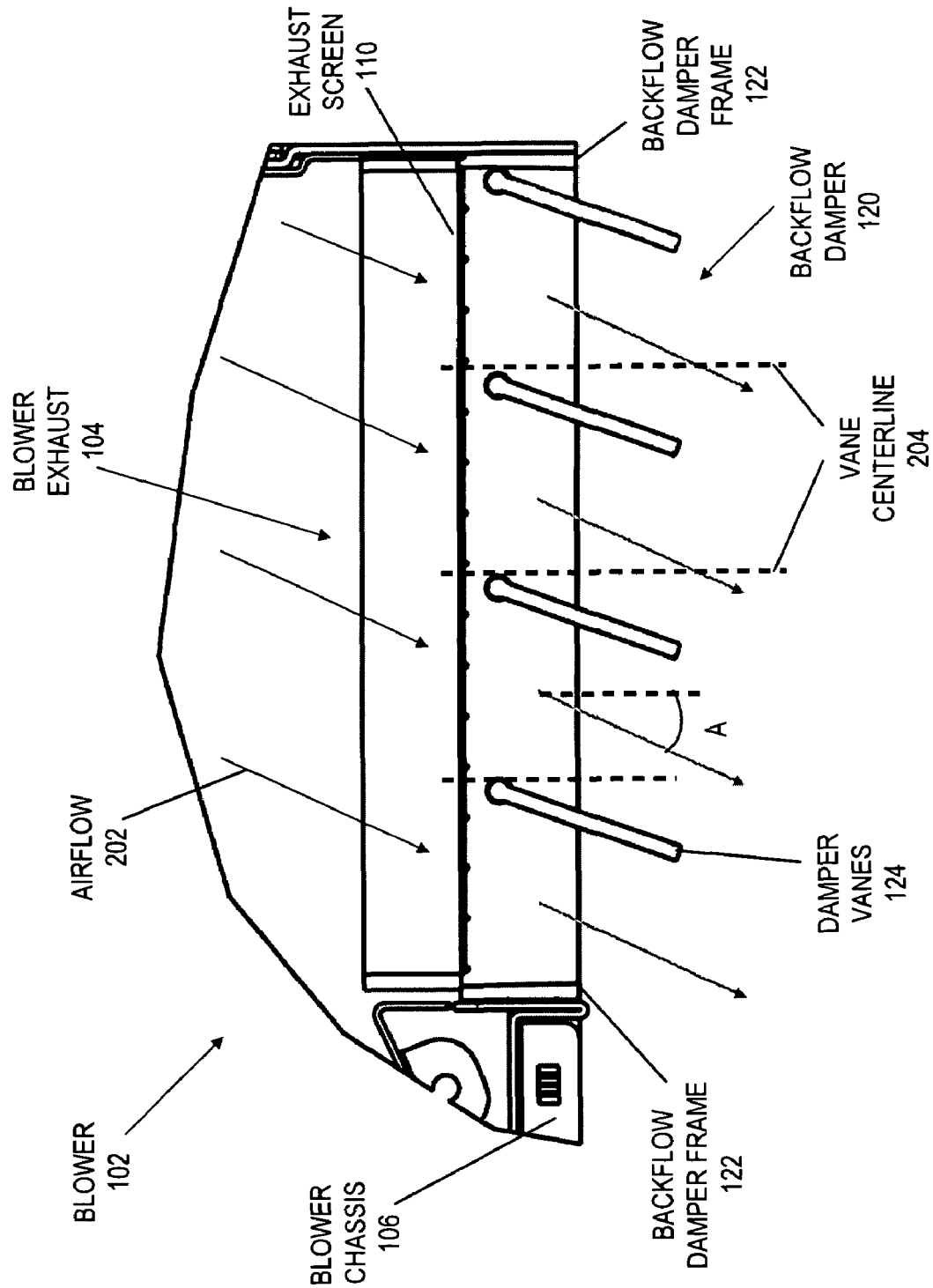
FIG. 2 depicts a top cut-away view of the blower of FIG. 1 during normal operation according to one embodiment.

FIG. 2 depicts a top cut-away view of the blower 102 of FIG. 1 during normal operation according to one embodiment. In FIG. 2, an example path of airflow 202 during normal operation of blower 102 from the blower exhaust 104 and through the backflow damper 120 is depicted with directional arrows. The airflow 202 flows from within the chassis 106 through the blower exhaust 104, through optional exhaust screen 110, and then through the area formed by the backflow damper frame 122. The damper vanes 124 may rotate to a position substantially parallel with airflow 202 at an angle 'A' from a vane centerline 204. Vane centerline 204 may be an axis coincident with an axis perpendicular from the side surface of the blower chassis 106.

The precise angle to which a damper vane 124 will rotate in an airflow with a steady direction will be depend on the design, including aerodynamic design, of the damper vane 124 but may be generally such that a low cross-sectional area side of the damper vane 124 is presented to the airflow with the flow passing over the surface of both sides of the main vane body. The damper vanes 124 thus follow the trajectory of the exhaust and impede the airflow 202 only by their cross-sectional area. The damper vanes 124 may advantageously never rotate past the vane centerline 204 during normal operation assuming airflow 202 remains angled in the same direction. Since the damper vanes 124 will close in the direction they are already angled upon blower failure because of the pressure differential, the direction of the damper vanes 124 impacts the closing of the backflow damper 120 as a whole. Because the damper vanes 124 of the disclosed embodiments do not pass the vane centerline 204, the additional vane (and additional impedance) required of prior art designs to accommodate inverted blowers 102 is not required. As will be described in more detail in relation to FIGS. 7 and 8, a stop or other means may optionally be added to the damper vane 124 and/or backflow damper frame 122 to physically prevent rotation of the damper vane 124 past the vane centerline 204 to prevent problems due to user error, during shipping, etc.

Figure 3:
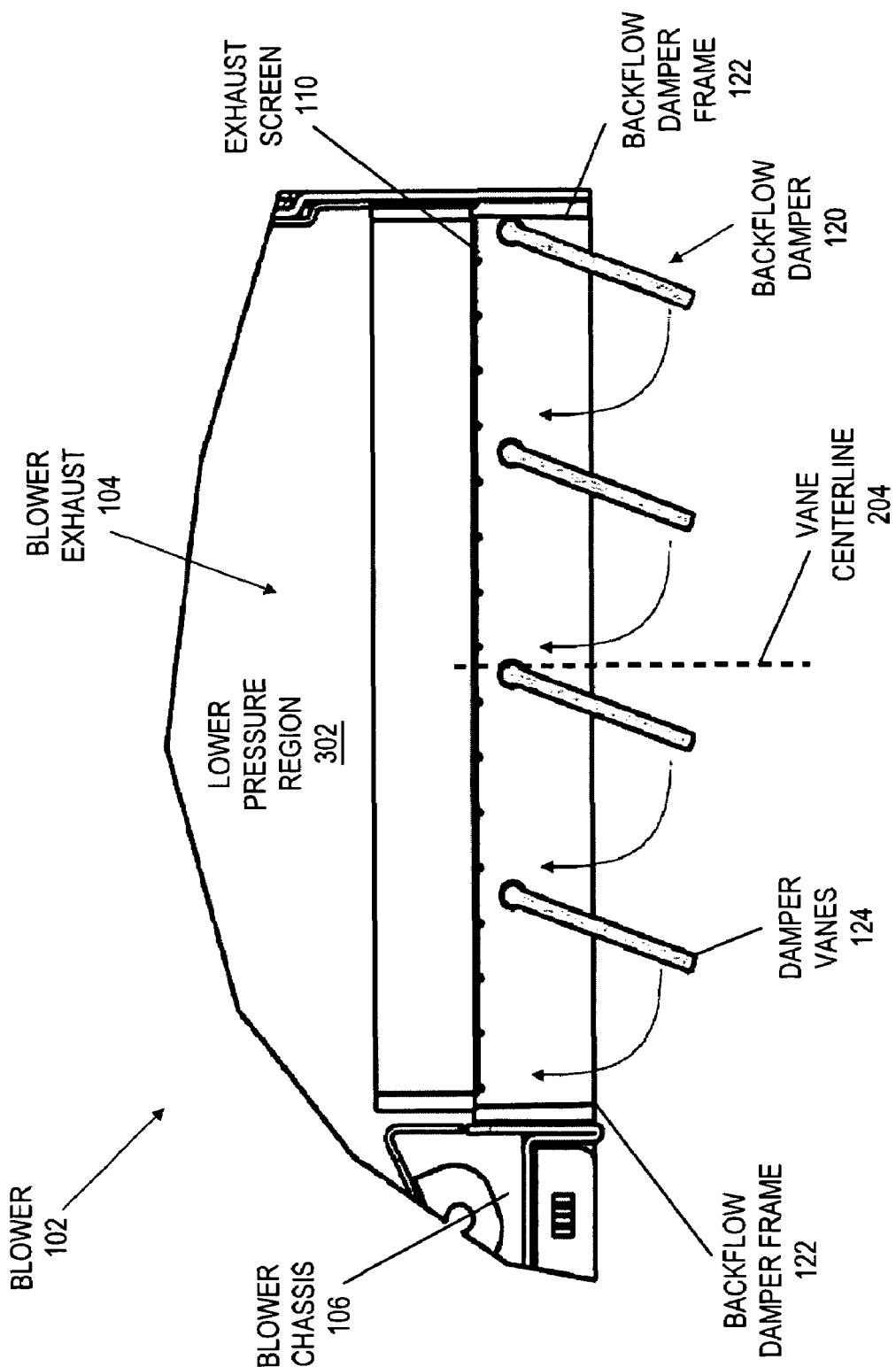
FIG. 3 depicts a top cut-away view of the blower of FIG. 1 immediately after blower failure according to one embodiment.

FIG. 3 depicts a top cut-away view of the blower 102 of FIG. 1 immediately after blower 102 failure according to one embodiment. As can be seen in FIG. 3, a lower pressure region 302 may form within the blower chassis 106 after failure of the blower 102. The lower pressure region 302 may be created by, for example, the continued operation of other blowers 102 in a system such as a blade server with multiple blowers. As the pressure in the lower pressure region 302 begins to drop and the airflow stops, the damper vanes 124 each begin rotation toward a closed position. Because each damper vane 124 is at an acute angle with respect to vane centerlines 204, the damper vanes 124 will each rotate closed in the same direction, allowing for the backflow damper 120 to close completely (as shown subsequently in FIG. 4).

Figure 4:
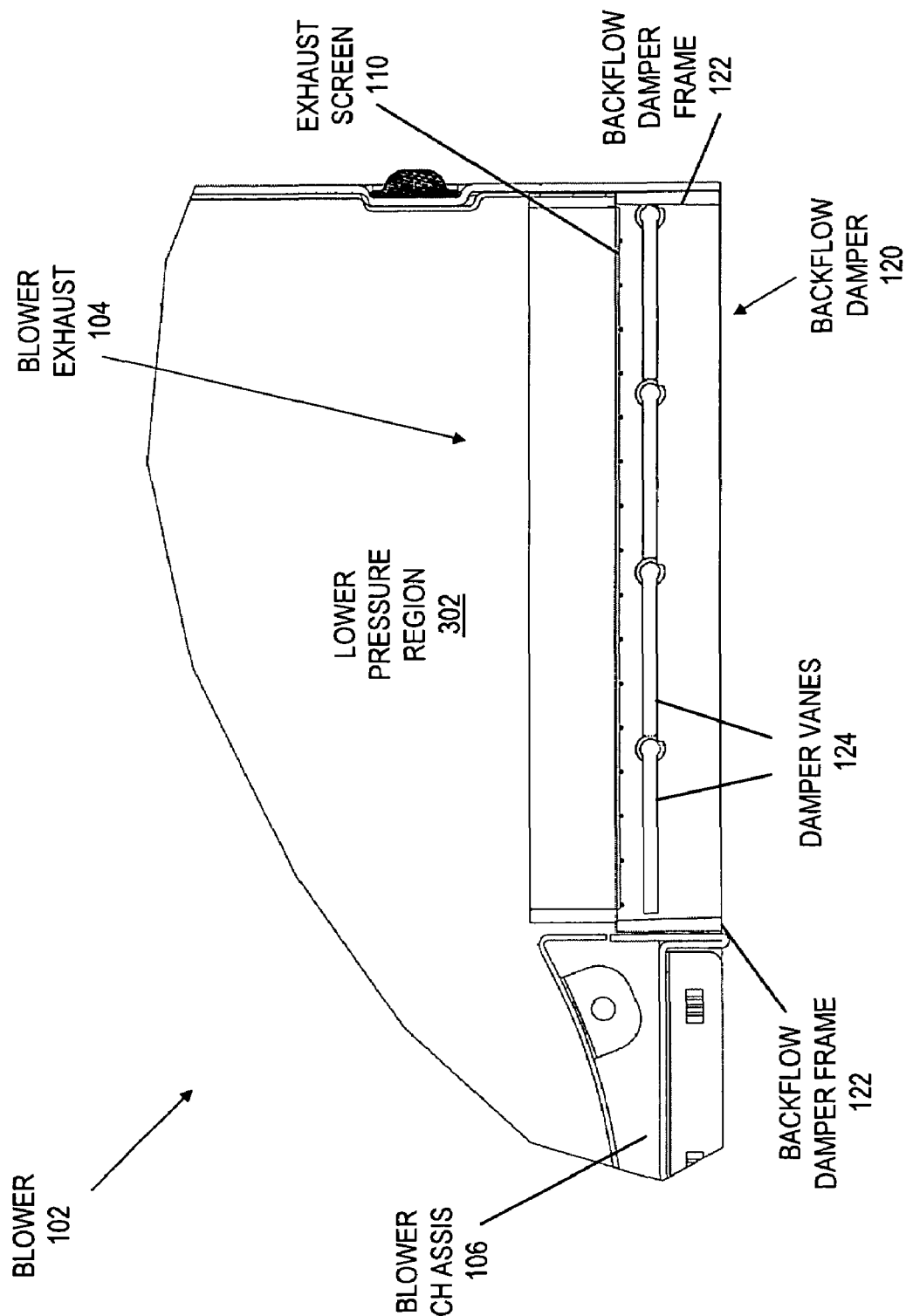
FIG. 4 depicts a top cut-away view of the blower of FIG. 1 after blower failure and closing of the backflow damper according to one embodiment.

FIG. 4 depicts a top cut-away view of the blower 102 of FIG. 1 after blower 102 failure and closing of the backflow damper 120 according to one embodiment. The embodiment of FIG. 4 represents the closed position for the damper vanes 124 after they have rotated from their positions shown in FIG. 3 immediately after failure of the blower 102. As can be seen in FIG. 4, the lower pressure region 302 within the blower chassis 106 remains as long as the blower 102 remains inoperable. As a result of the damper vanes 124 rotating in their designed direction (by starting the rotation at an acute angle to the perpendicular), the closed damper vanes 124 effectively close off the airflow area of the backflow damper frame 122 and prevent additional backflow into the blower exhaust 104. The damper vanes 124 may stay in a closed position as long as the lower pressure region 302 has a lower or equal pressure to the outside ambient pressure.

Figure 5:
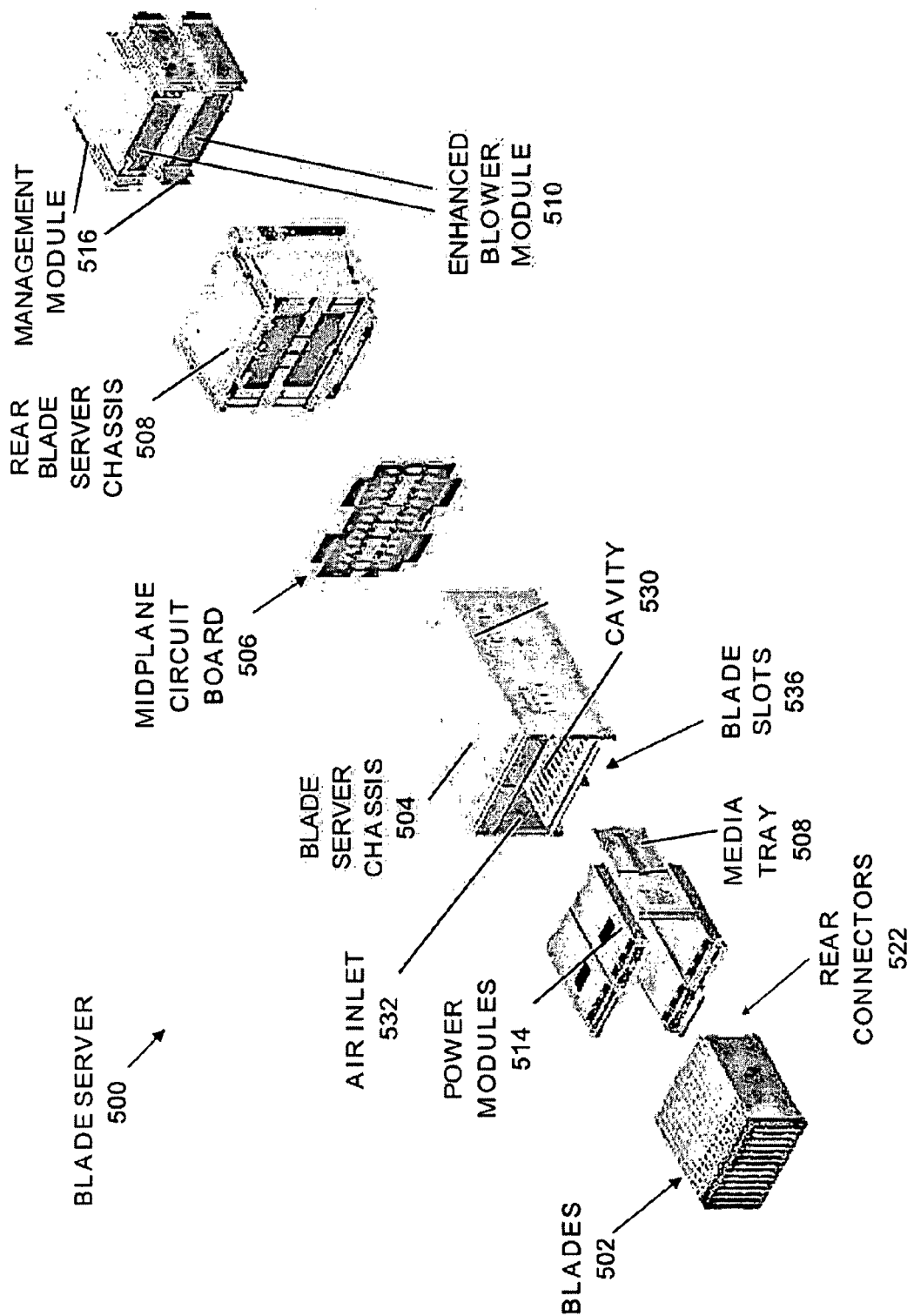
FIG. 5 depicts a front, top, and right side exploded perspective view of a blade server with a chassis, blades, and an enhanced blower module according to one embodiment.

FIG. 5 depicts a front, top, and right side exploded perspective view of a blade server with a chassis, blades, and an enhanced, blower module according to one embodiment. The blade server 500 of the depicted embodiment may represent one application of the blowers 102 with backflow dampers 120 as described herein. In the depicted embodiment, the blade server 500 includes a chassis 504 partially enclosing a cavity 530 with an open front side (air inlet 532) that may receive one Or more blades 502 to form a blade server 500. The blade server chassis 504 may include a plurality of blade slots 536 to receive inserted blades 502. The embodiment of FIG. 5 includes fourteen blades 502 that may be hot-pluggable into the fourteen blade slots 536 in the front of the blade server chassis 504. The blades 502 and modules (except the midplane circuit board) of the blade server 500 may be hot-pluggable so that if one fails it may be replaced without shutting down system power. An example blade server 500 may be a modified International Business Machines (IBM) Corporation's IBM eServer™ BladeCenter® system, a high-density, rack-mounted packaging architecture for servers that provides input/output (I/O), systems management, and power to blades 502. One of ordinary skill in the art will recognize, however, that other types of blower applications besides blade servers 500 may be utilized within the scope of the invention.

A media tray 508 may also be included within blade server chassis 504. The media tray 508 may include a floppy disk drive, and/or CD-ROM drive and may couple to any of the attached blades 502. The media tray 508 may also house an interface board on which is mounted interface light emitting diodes (LEDs), a thermistor for measuring air inlet temperature, and a USB controller hub. Each blade 502 may have one or more rear connectors 522 to operably connect to the chassis 504 by insertion into the midplane circuit board 506 located at the rear of the chassis 504. Blades 502 may interface with other components of the blade server 500 via the midplane circuit board 506 via interfaces such as a power interface, communications or network interface (e.g., Ethernet, Fibre Channel), a management module serial link, a VGA analog video link, a keyboard/mouse USB link, a CD-ROM and floppy disk drive USB link, control signal link, or other interface. These interfaces may provide the ability to communicate to other components in the blade server 500 such as management modules, switch modules, the CD-ROM, etc. These interfaces may also be duplicated to provide redundancy. One or more power modules 514 may also be included within blade server chassis 504 in some embodiments. The power modules 514 may provide DC operating voltages for the blades 502 and other components by, for example, converting power from an AC source.

The blade server 500 may also include a rear blade server chassis 508 that contains a plurality of hot-swappable modules. The rear chassis 508 may attach to the rear of the blade server chassis 504 for forming the structure of the blade server 500. Hot-swappable modules may include one or more enhanced blower modules 510 as well as other modules such as switch modules and management modules. Enhanced blower modules 510 may include one or more variable-speed blowers 102 to draw air from the front of the blade server 500 and exhaust it to the rear in order to cool its components.

Other types of modules may include switch modules and management modules. Switch modules may provide network and/or switch functions to the blades 502. An Inter-Integrated Circuit (I2C) Serial Bus Interface may be used by a management module 516 to configure, monitor and control the switch modules. Switch modules may provide Ethernet connectivity in some embodiments, but may also provide Fibre Channel or other connectivity. Management modules may provide basic management functions such as controlling, monitoring, alerting, restarting, and diagnostics to the blade server 500, including the chassis 504, blades 502, modules, and shared resources. The management module may consist of a processor and keyboard, video, and mouse (KVM) switch function and may be operably connected to other modules, the midplane circuit board 506, or other components. Management modules may also work in conjunction with a baseboard management controller (BMC) of a blade 502 to provide management functions.

Blades 502 (which may also be known as server blades or processor blades) may not only perform processor or server functions but may also perform other functions, such as a storage blade that includes hard disk drives and whose primary function is data storage. Blades 502 may provide the processor, memory, hard disk storage and firmware of an industry standard server. In some embodiments, blades 502 may be general- or specific-purpose servers that contain components such as processors, memory, optional local integrated drive electronics (IDE) or Small Computer System Interface (SCSI) disk drives, Ethernet or other network controllers, the BMC, and power conversion circuitry to convert a 12 V DC input to the various voltages required by blade 502 electronics components. In addition, they may include KVM selection via a control panel, an onboard service processor, and access to the floppy and CD-ROM drives in the media tray 508. Each blade 502 may have a control panel with light-emitting diodes (LEDs) to indicate current status plus switches for power on/off, selection of server blade, reset, nonmaskable interrupt reset (NMI) for core dumps, or other functions. A daughter card (not shown) may be connected to a blade 502 via an onboard bus, connector or other interface to provide additional high-speed links to the switch modules.

Blades 502 may be hot-swapped without affecting the operation of other blades 502 in the blade server 500. A blade 502 may typically be implemented as a single slot card but may, in some cases, require two or more slots. A blade 502 may use any microprocessor technology (i.e., be from any microprocessor family) as long as it is compliant with the mechanical and electrical interfaces (and is desirably consistent with the power and cooling requirements of the blade server 500). Blades 502 may also contain a baseboard management controller (BMC) (not shown) to work in conjunction with the management module 516 to manage the blade 502. BMCs (which may also be known as local service processors) may support blade server 500 functions, such as communication with the management modules 516, with the control panels and LEDs, with the control panel buttons for power on/off, etc., and with inventory, error reporting, and environmental monitoring and reporting. The BMCs may also support other functions such as serial over LAN (SOL) and wake on LAN (WOL).

Blades 502 may include server or processor blades as well as expansion blades. An expansion blade 502, also known as a 'sidecar', can be added to a base, or parent, blade 502 to expand its functionality by connecting the expansion blade 502 to a bus, connector, or other interface bus of the parent. Sidecars may include blade storage expansion (BSE) units with hard drives, a PCI I/O expansion unit that can support a variety of PCI adapters, special function add-ons (e.g., a daughter card or a specialized processing unit), an expansion unit that may support additional I/O daughter cards, or any other expansion blade known now or later developed. Sidecars, may also be an actual blade 502 in some embodiments. Sidecars may be stacked in layers (i.e., sidecar attached to sidecar attached to parent blade 502) and may be attached to any external surface of the blade 502 besides the front or rear. Other types of blades 502 may also be used, whether now in use or later developed, as one of ordinary skill in the art will recognize. Blades 502 may be physically connected, or attached, either when physically external or internal to the chassis 504. For example, a sidecar may mate with an already installed blade 502 by being inserted next to blade 502 until clicking into place. The same sidecar may have a release mechanism that may be depressed so that an operator may remove the sidecar from the chassis 504 without removing the blade 502 to which it was connected.

Cooling of blades 502 may be accomplished by the enhanced blower modules 510 drawing air from the front of the blade server 500 through air inlet 532 and exhausting the air to the rear so that the air passes through and cools the blades 502. The enhanced blower modules 510 may each have one or more blowers 102 (not shown), and each blower 102 may have a backflow damper 120 (not shown). If a blower 102 of one of the enhanced blower modules 510 fails, the backflow damper 120 may advantageously close in response to the lower pressures generated by other, still operational blowers 102 or other sources of low pressure. The enhanced blower module 510 with the inoperable blower 102 may then be hot-swapped with a fully-operational enhanced blower module 510.

Figure 6:
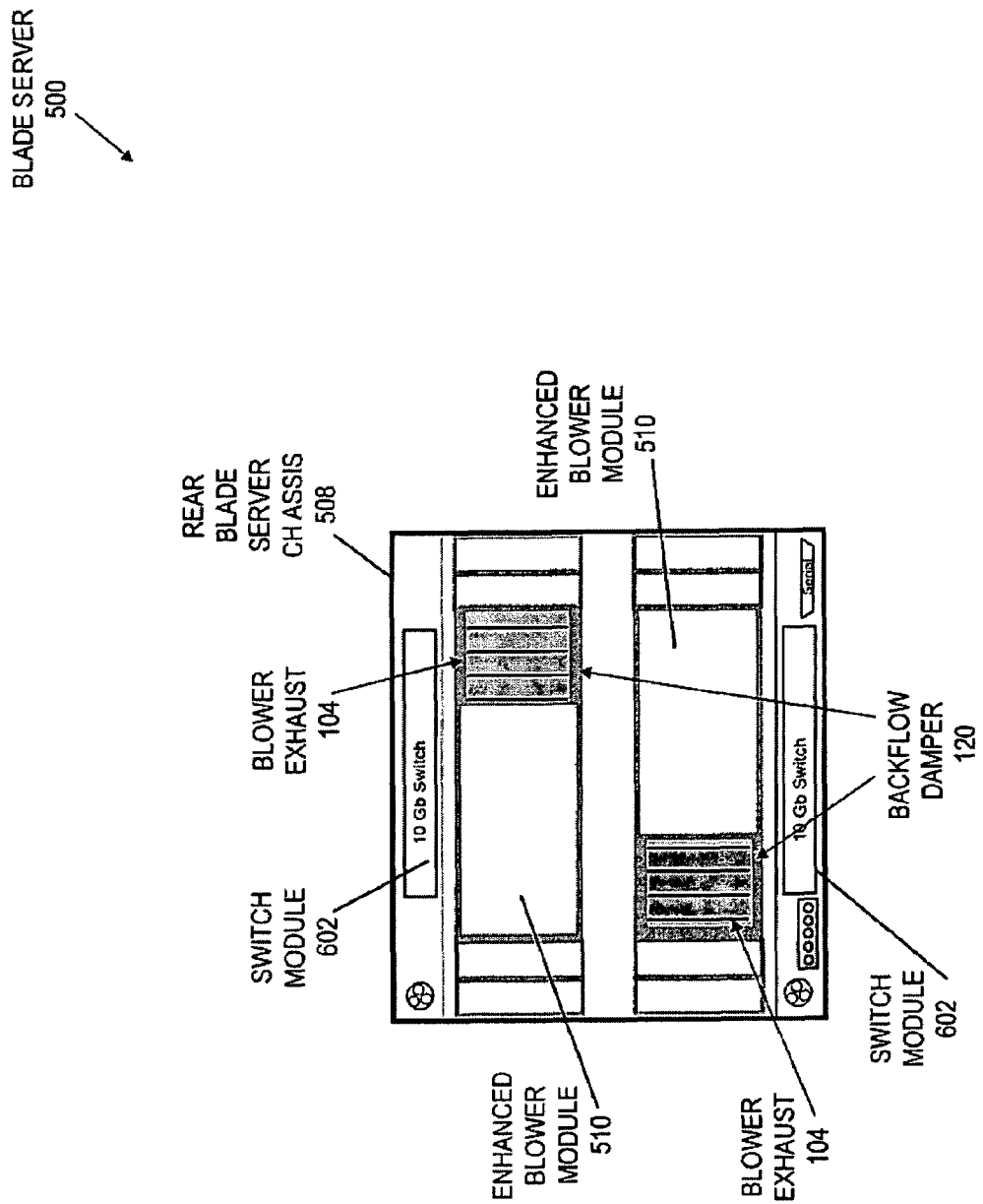
FIG. 6 depicts a rear view of the blade server of FIG. 5 including two enhanced blower modules according to some embodiments.

FIG. 6 depicts a rear view of the blade server of FIG. 5 including two enhanced blower modules according to some embodiments. In the depicted embodiment, blade server 500 includes two enhanced blower modules 510 docked in the rear blade server chassis 508, each with an integrated blower 102 and blower exhaust 104. In one embodiment, an enhanced blower module 510 includes one or more blowers 102 within it along with docking and other functionality, while in other embodiments the enhanced blower module 510 and blower 102 may be considered interchangeable. The blade server 500 and rear blade server chassis 508 may also include switch modules 602 or other interchangeable modules.

Each blower exhaust 104 may have a backflow damper 120 to minimize exhaust backflow upon failure of a blower 102. In the depicted embodiment, the two blower exhausts 104 direct airflow at an angle towards the center of the blade server 500 and away from the edges. Accordingly, the damper vanes 124 of the disclosed enhanced blower modules 510 will also point inward during normal operation.

Figure 7:
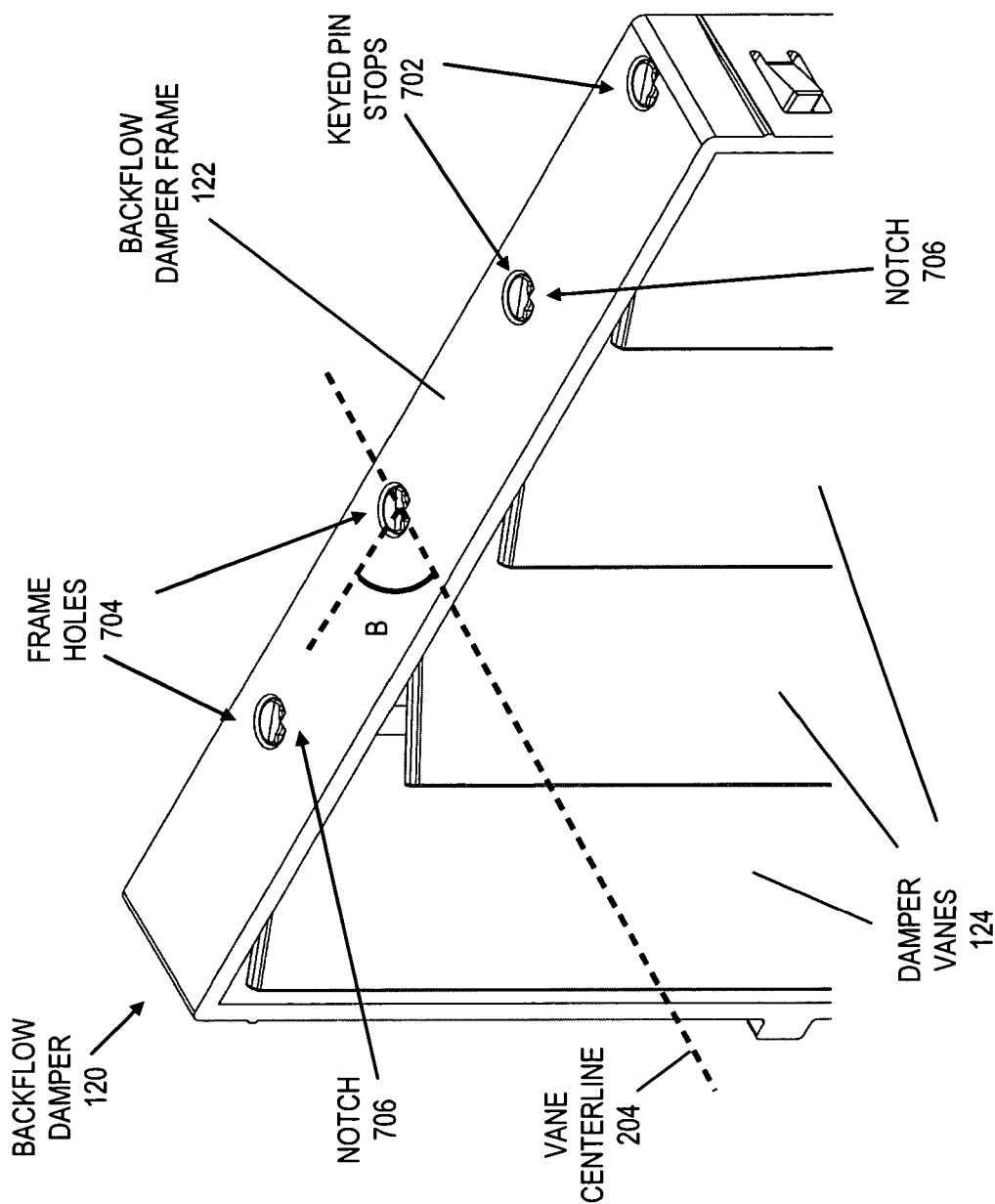
FIG. 7 depicts a front, top, and right perspective partial view of a backflow damper with a stop according to some embodiments.

FIG. 7 depicts a front, top, and right perspective partial view of a backflow damper 120 with a stop according to some embodiments. The backflow damper frame 122 of FIG. 7 includes a plurality of frame holes 704 for attaching the damper vanes 124. The frame holes 704 may be positioned in opposite pairs (only top pair shown in FIG. 7) to hold each end of the damper vanes 124. The backflow damper 120 of FIG 7 includes a stop for each damper vane 124 that physically prevents the damper vanes 124 from rotating past the vane centerline 204. The keyed pin stops 702 of FIG. 7 are accomplished by the profile of the frame hole 704 and damper vane 124 ends that permit only ninety (90) degrees of rotation. Each frame hole 704 includes a notch 706 that interacts with the end of the damper vane 124 to prevent excessive rotation.

One of ordinary skill in the art will recognize that many different types of stops are possible and that the use of stops is not necessary. The keyed pin stops 702 may be positioned on either one side of the backflow damper frame 122 or both sides (i.e., on opposing frame holes 704). The keyed pin stops 702 may also restrain movement to a total angle of less than ninety (90) degrees, such as by providing a notch 706/damper vane 124 combination that results in an angle 'B' less than ninety (90) degrees. Alternatively, other types of stops may also be used, such as a protrusion attached to the backflow damper frame that similarly restrains movement. Stops such as the keyed pin stops 702 may be particularly advantageous when the blowers 102 are being transported as they may be handled in many different directions, requiring a user to manually reconfigure the damper vanes 124 before initial usage unless stops are used.

Figure 8:
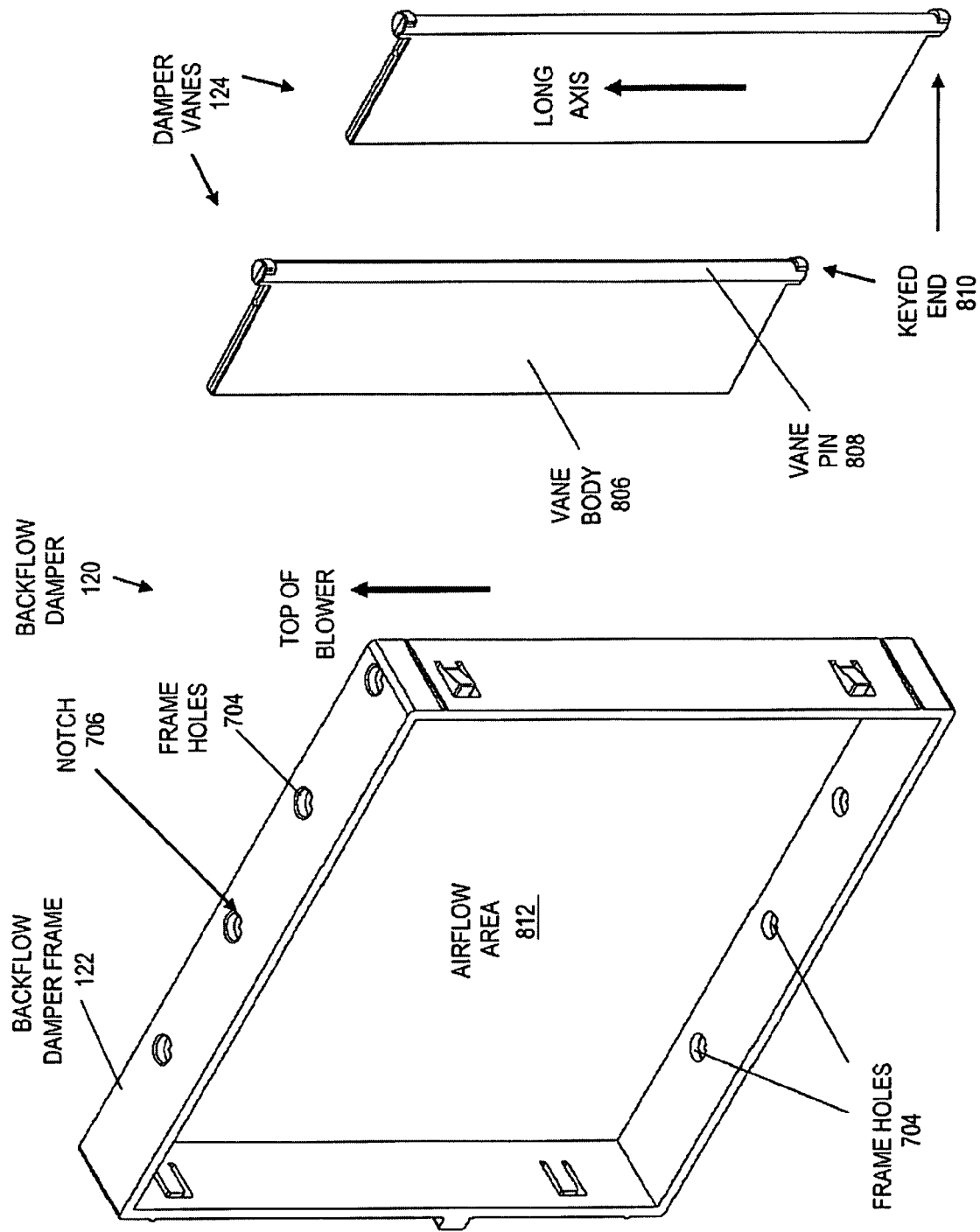
FIG. 8 depicts a front, top, and right perspective exploded view of a backflow damper with a stop according to some embodiments.

FIG. 8 depicts a front, top, and right perspective exploded view of a backflow damper 120 with a stop according to some embodiments. The damper vanes 124 may be installed in the backflow damper frame 122 vertically (parallel with an axis pointing to the top of a blower 102) via a vane pin 808 that inserts into the frame holes 704 of the backflow damper frame 122. The damper vanes 124 may be positioned within the airflow area 812 formed by the backflow damper frame 122. The disclosed damper vanes 124 include the vane pin having a long axis that will also be aligned vertically once installed. The vane body 806 is attached or integrated with the vane pin 808. Forces applied to the vane body 806 (i.e., pressure forces or airflow forces) may be transmitted to the vane pin 808 and cause rotation about the vane pin 808. In this fashion, the damper vanes 124 may rotate freely once the vane pin 808 is inserted into the frame holes 704.

The disclosed backflow damper 120 also has the keyed pin stop 702 of FIG. 7. Each vane pin 808 has a keyed end 810 (on either or both of its ends) which interacts with notches 706 of the frame holes 704 to restrain movement of the damper vanes 124 beyond a certain point. The damper vanes 124 may either be permanently attached to the backflow damper frame 122 or replaceably attached to the backflow damper frame 122. In an alternative embodiment, other attachment means may be used to rotatably attach the damper vanes 124 to the backflow damper frame 122, such as a pin and receiver, an axle, or any other design.

FIG. 9 depicts an example of a flow chart depicting closing a backflow damper 120 upon failure of a blower 102 according to one embodiment. Components or combinations of components of the backflow damper 120 may perform the elements of flow chart 900 while on a blower 102 in one embodiment. Flow chart 900 begins with element 902, where the backflow damper 120 receives an angled exhaust airflow from a blower exhaust 104. The backflow damper 120 may receive the airflow through an airflow area 812 formed by the backflow damper frame 122. As described previously, the exhaust airflow may advantageously be angled and not directly perpendicular from the side of the blower 102. While the blower 102 is operational and exhaust airflow is being received, the damper vanes 124 may freely rotate in the exhaust airflow at element 904. The damper vanes 124 may automatically rotate to a position based on their aerodynamic design with, generally speaking, a lower cross-sectional area facing the airflow and with the airflow passing over both sides of the damper vane 124.

The backflow damper 120 may have optional stops to prevent the damper vanes 124 from passing a vane centerline 204. If stops are included, the method of flow chart 900 performs decision block 906, where it is determined if the damper vane 124 has rotated such that it is reaching the vane centerline 204 (or other specified angle). If the damper vane 124 does reach the vane centerline 204, the stop may at element 908 block the rotation of the damper vanes 124 past the vane centerline 204 via keyed pin stop 702 or other means.

Until the blower fails and during normal operation, elements 904 through 908 may be repeated. Upon blower failure at decision block 910, the method of flow chart 900 may continue to element 912, rotating the damper vanes 124 to a closed position, after which the method terminates. The damper vanes 124 may rotate because of the pressure differential caused by the failure of the blower 102 as the pressure inside the blower 102 drops relative to ambient pressure and causes a pressure force to rotate the damper doors 124 closed.

It will be apparent to those skilled in the art having the benefit of this disclosure that the present invention contemplates a system, method, and apparatus for preventing exhaust backflow for a blower. It is understood that the form of the invention shown and described in the detailed description and the drawings are to be taken merely as examples. It is intended that the following claims be interpreted broadly to embrace all the variations of the example embodiments disclosed.

While certain operations have been described herein relative to a direction such as "above" or "below" it will be understood that the descriptors are relative and that they may be reversed or otherwise changed if the relevant structure(s) were inverted or moved. Therefore, these terms are not intended to be limiting.

Although the present invention and some of its advantages have been described in detail for some embodiments, it should be understood that various changes, substitutions and alterations can be made herein without departing from the spirit and scope of the invention as defined by the appended claims. Although an embodiment of the invention may achieve multiple objectives, not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A blower system, the system comprising:
    an invertible blower chassis having a blower intake fan having a rotational axis to draw air into the invertible blower chassis substantially along the rotational axis of the blower intake fan and having a blower exhaust substantially perpendicular to the blower intake fan rotational axis to direct an airflow from a side of the blower chassis at an airflow angle that is between an axis perpendicular to the chassis side and an axis parallel to the chassis side, the blower chassis being adapted to be used with both a first side and a second, opposite side being substantially perpendicular to a vertical axis aligned with a gravitational force, wherein the airflow angle is at an acute non-zero angle from the axis perpendicular to the chassis side and wherein further the airflow angle is substantially large such that the airflow angle is non-perpendicular to the chassis side;
    a backflow damper frame attached to the blower chassis and positioned to receive airflow from the blower chassis at the acute non-zero airflow angle;
    one or more damper vanes rotatably attached to the backflow damper frame, each damper vane having a vane body with a long axis, wherein the long axes of the one or more vane bodies are substantially parallel to the chassis vertical axis, and wherein the one or more damper vanes are adapted to freely rotate between a first, closed position and a second, open position; and
    wherein the one or more damper vanes block airflow into the blower exhaust when the one or more damper vanes are in the closed position, and wherein further the one or more damper vanes freely rotate to a position where the one or more vane bodies are substantially parallel to the airflow from the blower exhaust at the acute non-zero airflow angle.

2. The system of claim 1, wherein the backflow damper frame further comprises a pair of opposing frame holes for each of the one or more damper vanes.

3. The system of claim 2, wherein at least one of each pair of opposing frame holes comprises a notch to restrain a keyed end of a damper vane.

4. The system of claim 1, wherein the one or more damper vanes comprise four damper vanes.

5. The system of claim 1, wherein the one or more damper vanes comprise two or more damper vanes.

6. The system of claim 1, wherein the one or more damper vanes are constrained to rotate within approximately ninety (90) degrees or less from the closed position.

7. The system of claim 1, wherein the one or more damper vanes each further comprise a vane pin to rotatably attach to frame holes of the backflow damper frame.

8. The system of claim 7, wherein at least one vane pin for each damper vane comprises a keyed end.

9. A backflow damper apparatus for a blower, comprising:
    a backflow damper frame having a perimeter defining an airflow area, the airflow area of the backflow damper frame, when installed in a blower, being centered geometrically about an axis substantially perpendicular to a rotational axis of a blower intake fan of the blower that draws in air substantially along the rotational axis of the blower intake fan, the backflow damper frame being adapted to receive and pass an angled airflow from a blower exhaust through the airflow area where the blower exhaust airflow flows substantially at an airflow angle that is between an axis perpendicular to the airflow area and an axis parallel to the airflow area, wherein the airflow angle is at a non-zero acute angle from the axis perpendicular to the airflow area and wherein further the airflow angle is substantially large such that the airflow angle is non-perpendicular to the airflow area;
    one or more damper vanes rotatably attached to the perimeter of the backflow damper frame, each damper vane having a vane body with a long axis, wherein the long axes of the one or more vane bodies are adapted to be vertically oriented when the backflow damper is attached to the blower, and wherein the one or more damper vanes are adapted to freely rotate between a first, closed position and a second, open position; and
    wherein the one or more damper vanes block airflow into the blower exhaust when the one or more damper vanes are in the closed position, and wherein further the one or more damper vanes rotate to a position where the one or more vane bodies are substantially parallel to the airflow at the non-zero acute airflow angle from the blower exhaust during blower operation.

10. The apparatus of claim 9, wherein the backflow damper frame further comprises a pair of opposing frame holes for each of the one or more damper vanes.

11. The apparatus of claim 10, wherein at least one of each pair of opposing frame holes comprises a notch to restrain a keyed end of a damper vane.

12. The apparatus of claim 9, wherein the one or more damper vanes comprise four or more damper vanes.

13. The apparatus of claim 9, wherein the one or more damper vanes are constrained to rotate within approximately ninety (90) degrees or less from the closed position.

14. The apparatus of claim 9, wherein the one or more damper vanes each further comprise a vane pin to rotatably attach to frame holes of the backflow damper frame.

15. The apparatus of claim 14, wherein at least one vane pin for each damper vane comprises a keyed end.

* * * * *